United States Patent
Mueller et al.

(10) Patent No.: US 10,788,527 B2
(45) Date of Patent: Sep. 29, 2020

(54) METHOD FOR DETECTING AN ERROR IN A GENERATOR UNIT

(71) Applicant: Robert Bosch GmbH, Stuttgart (DE)

(72) Inventors: Manuel Mueller, Kisslegg (DE); Miriam Riederer, Fellbach (DE); Paul Mehringer, Stuttgart (DE); Sebastian Paulus, Esslingen am Neckar (DE); Zoltan Ersek, Korntal-Muenchingen (DE)

(73) Assignee: Robert Bosch GmbH, Stuttgart (DE)

( * ) Notice: Subject to any disclaimer, the term of this patent is extended or adjusted under 35 U.S.C. 154(b) by 201 days.

(21) Appl. No.: 15/776,826

(22) PCT Filed: Oct. 28, 2016

(86) PCT No.: PCT/EP2016/076007
§ 371 (c)(1),
(2) Date: May 17, 2018

(87) PCT Pub. No.: WO2017/084857
PCT Pub. Date: May 26, 2017

(65) Prior Publication Data
US 2018/0340969 A1    Nov. 29, 2018

(30) Foreign Application Priority Data
Nov. 18, 2015   (DE) .................. 10 2015 222 733

(51) Int. Cl.
*G01R 31/00*        (2006.01)
*G01R 31/34*        (2020.01)
(Continued)

(52) U.S. Cl.
CPC ......... *G01R 31/006* (2013.01); *G01R 31/343* (2013.01); *H02J 7/24* (2013.01);
(Continued)

(58) Field of Classification Search
None
See application file for complete search history.

(56) References Cited

U.S. PATENT DOCUMENTS 5,777,459 A * 7/1998 Bansal ................... H02P 9/48
                                                       290/40 B
7,791,352 B2   9/2010 Nasswetter
(Continued)

FOREIGN PATENT DOCUMENTS

DE        10347185        5/2005
DE       102013200637     7/2014
(Continued)

OTHER PUBLICATIONS

International Search Report for Application No. PCT/EP2016/076007 dated Feb. 3, 2017 (English Translation, 2 pages).

*Primary Examiner* — Jermele M Hollington
*Assistant Examiner* — Suresh K Rajaputra
(74) *Attorney, Agent, or Firm* — Michael Best & Friedrich LLP

(57) ABSTRACT

A method for detecting an error in a generator unit which has an electric machine (100) with a rotor winding (110) and a stator winding (120) and a rectifier (130) connected thereto, via which rectifier the electric machine (100) is connected to an electrical system (150) of a motor vehicle, the excitation current (IE) flowing through the rotor winding (110) of the electric machine (100) being plotted and it being concluded that there is an error in the generator unit depending on whether a frequency component (A) of a frequency spectrum of the plot of the excitation current (IE) in a frequency range above a lower speed limit (SW) is larger than a threshold value (S).

14 Claims, 11 Drawing Sheets

(51) Int. Cl.
*H02J 7/24* (2006.01)
*H02M 7/162* (2006.01)
*H02M 1/32* (2007.01)

(52) U.S. Cl.
CPC ............ *H02M 1/32* (2013.01); *H02M 7/162* (2013.01); *H02M 7/1623* (2013.01)

(56) References Cited

U.S. PATENT DOCUMENTS

| | | | |
|---|---|---|---|
| 10,411,625 B2 * | 9/2019 | Magini | H02P 9/08 |
| 10,514,421 B2 * | 12/2019 | Reutlinger | H02P 9/10 |
| 10,581,354 B2 * | 3/2020 | Ersek | G01R 31/006 |
| 2014/0197842 A1 * | 7/2014 | Mehringer | G01R 31/343 |
| | | | 324/503 |
| 2015/0171776 A1 * | 6/2015 | Ota | B60L 9/22 |
| | | | 318/8 |
| 2018/0304751 A1 * | 10/2018 | Mueller | B60L 3/0023 |
| 2019/0011488 A1 * | 1/2019 | Mueller | H02P 29/0241 |

FOREIGN PATENT DOCUMENTS

| | | |
|---|---|---|
| DE | 102015211933 | 12/2016 |
| WO | 2015028744 | 3/2015 |

\* cited by examiner

METHOD FOR DETECTING AN ERROR IN A GENERATOR UNIT

BACKGROUND OF THE INVENTION

The present invention relates to a method for detecting an error in a generator unit as well as to an arithmetic unit, in particular a generator controller, and a computer program for carrying out the method.

Motor vehicles are equipped with an electrical system which is supplied with voltage via an electric machine, e.g. an externally excited synchronous machine, operated as a generator. In order to control the electrical system voltage, an exciter current of the electric machine can be controlled. The electric machine is generally connected to the electrical system via a rectifier and with said rectifier forms a generator unit. Errors such as, e.g., short circuits can occur in such generator units, which errors should be detected whenever possible.

The German patent application DE 10 2015 211 933, which is not pre-published, discloses a method for detecting an error in a generator unit, which comprises an electric machine with a rotor winding and a stator winding and a rectifier connected thereto, via which the electric machine is connected to an electrical system, wherein a voltage of the electrical system is controlled to a target value via an excitation current flowing through the rotor winding of the electric machine and a plot of the excitation current is monitored, and wherein it is concluded that there is an error in the generator unit if an oscillatory plot of the excitation current is detected, wherein a magnitude of the oscillation lies above a threshold value.

SUMMARY OF THE INVENTION

According to the invention, a method for detecting an error in a generator unit as well as an arithmetic unit and a computer program for carrying out the method In a first aspect, the invention relates to a method for detecting an error in a generator unit, which has an electric machine with rotor winding and stator winding and a rectifier connected thereto, via which the electric machine is connected to an electrical system of a motor vehicle, wherein a temporal profile of an excitation current flowing through the rotor winding is plotted, and wherein it is concluded that there is an error in the generator unit depending on whether a frequency component of a frequency spectrum of the plot of the excitation current in a frequency range above a predeterminable lower speed limit is larger than a predeterminable threshold value. The predeterminable lower speed limit and/or the predeterminable threshold value can be here variably predeterminable or also be predetermined to a fixed value.

In this way, different types of errors in the rectifier and/or the electric machine can be easily detected. This is possible because such errors have an effect on the excitation current. Whereas, by means of a simple comparison between a phase voltage and half of the battery or respectively electrical system voltage, a separation of a complete phase from the rectifier cannot, e.g., be detected, such a separation has, however, an effect on the excitation current.

It has been recognized that oscillations or respectively fluctuations in the excitation current then particularly occur if irregularities appear in the phase currents, e.g., due to a short circuit or an interruption. Because oscillations can be particularly easily detected, a simple and effective option therefore results for detecting errors in the rectifier and/or the electric machine. It has been recognized that these oscillations show a significant signature in the frequency spectrum which the plot of the excitation current has. An error in the generator unit can be particularly easily detected by means of an analysis of this frequency spectrum.

Expediently, the error comprises a short circuit and/or an interruption in a high-side path between the rectifier and the vehicle electrical system, a short circuit and/or an interruption in a low-side path between the rectifier and the vehicle electrical system and/or a separation of a phase from the rectifier and/or a short circuit of phases to each other. In the electric machine, the error can compromise a short circuit of the stator to the vehicle electric system, i.e. to positive (B+) and/or negative (B−), an interruption in a wire of the stator winding, a short circuit between wires of the stator winding and/or a short circuit between different phases. Because an electric machine such as, e.g., an externally excited synchronous machine has, e.g., three or five phases, an error can also occur that includes different phases even if this is also unlikely. In that respect, errors which comprise a short circuit and a separation of two different paths can, e.g., also occur. Said errors relate to the errors which usually occur with generator units. Particularly short circuits or interruptions of a path lead to significant oscillations in the excitation current, which can be easily detected. A separation of a complete phase, i.e. an interruption on the high-side as well as the low-side path of the same phase, leads likewise to an oscillation in the excitation current due to the changed currents. This has no influence on the base frequency of the voltage of an individual phase as long as it does not relate to the only monitored phase. Such a separation of a phase can therefore as a rule not be detected with the known method mentioned above with the monitoring of one phase, as this is the case with conventional controllers.

In some embodiments, the error in the generator unit is inferred when a cumulative distribution function of the frequency spectrum in the frequency range above the lower speed limit is greater than the predeterminable threshold value. This method is particularly simple.

In some embodiments, an error frequency to is ascertained when the frequency component of the frequency spectrum of the plot of the excitation current is greater than a predeterminable threshold value. This means that the sum of all the frequency components at the frequencies, which lie within this environment, is greater than the predeterminable threshold value. The environment can particularly be a region delimited in a downward direction by a lower frequency edge and in an upward direction by an upper frequency edge, in particular a region of a fixed width or a fixedly predeterminable width, wherein the error frequency lies within this region. It has been shown that, depending on which error is present in the generator unit, the frequency components of different frequencies in the frequency spectrum of the plot of the excitation current take on large values. By extracting one or a plurality of error frequencies, it is possible to particularly reliably identify which error is present.

In some embodiments, an association of error frequencies to possible errors is reserved. Provision can then be made for it to be decided in dependence on the error frequency determined whether errors from a list of possible errors in the generator unit are or are not present in said generator unit. It is then, in particular, also possible that a decision is made that more than one error from the list of possible errors in the generator unit is present. In this way, a comprehensive diagnosis of the generator unit can be carried out in a particularly simple manner.

Provision can particularly be made for the list of possible errors to comprise a short circuit and/or an interruption in a high-side path, a short circuit and/or an interruption in a low-side path between the rectifier and the vehicle electrical system and/or a separation of one of the phases from the rectifier, and wherein, depending on the determined error frequency, a decision is made as to which of these errors is present. It has been ascertained that it can be simply differentiated with the use of the error frequency whether the short circuit or the separation of the phase is present.

According to the invention, if the error frequency ascertained corresponds to a rotational speed of the generator multiplied by the number of pole pairs of the generator, a decision is made that the short circuit is present in the high-side path or the error is present in the low-side path. Whether said short circuit is present on the high-side or the low-side cannot be initially differentiated using the error frequency.

This differentiation is however possible depending on a temporal profile of a phase voltage. In particular, it is not required here for the phase, in the high-side path of which or the low-side path of which the short circuit is present and the phase, the temporal profile of the phase voltage of which is evaluated, to be the same phase.

If it is decided that the short circuit is present in the high-side path or the error is present in the low-side path, provision can then be made in another aspect for a reduction in the amount of the excitation current or a pulsing of the excitation current to be carried out. The pulsing means that a clock frequency of one of the switches connected in series to the rotor winding is reduced. The clock frequency should advantageously be reduced here to the extent that a period duration is just smaller than a thermal settling time of a wire of the stator winding, in particular to a clock frequency of less than 1/s, for example 0.1/s.

By means of a reduction in the excitation current, the current flowing in the stator is also reduced so that the feedback to the excitation current also decreases. In this way, errors can be particularly reliably suppressed by a power output of the generator being effectively reduced.

In a further aspect, provision can be made for it to be decided that there is a separation if the error frequency ascertained corresponds to twice a rotational speed of the generator multiplied by the number of pole pairs of the generator.

On the other hand if it was detected that an error is present in the generator unit, but none of the errors from a list of possible errors reflect that this error is present, provision can be made for the generator to be switched off. This makes the method particularly reliable and safe.

An arithmetic unit according to the invention, in particular a generator controller, e.g. a control device of a motor vehicle, is especially equipped programmatically to carry out a method according to the invention.

The implementation of the method in the form of a computer program is also advantageous because this entails particularly low costs, in particular if an executing control device is used for other tasks and is therefore in any event already present.

Further advantages and embodiments of the invention ensue from the description and the accompanying drawings.

The invention is schematically depicted in the drawings using an exemplary embodiment and is described below with reference to the drawings.

DETAILED DESCRIPTION

Figure 1:
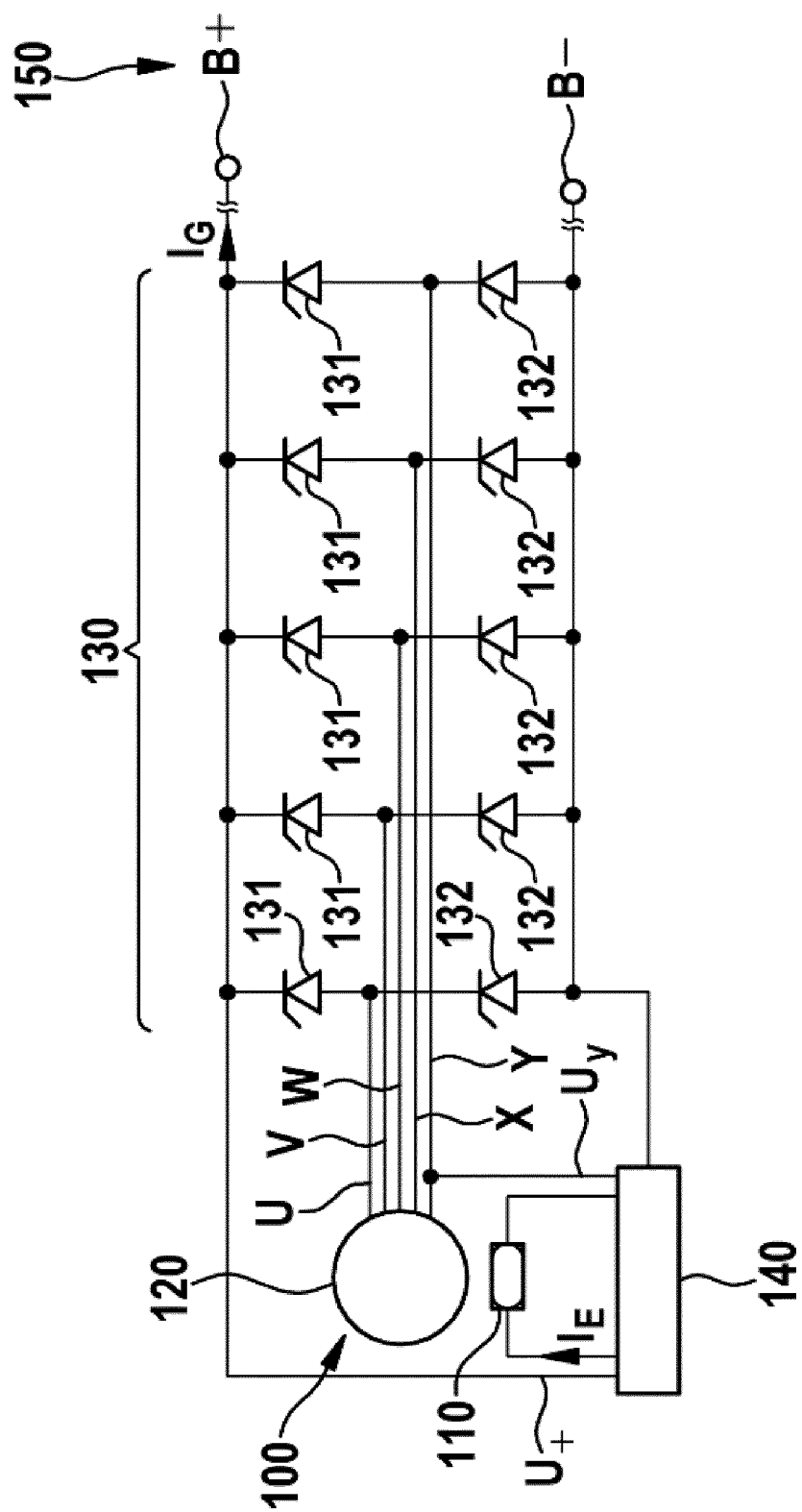
FIG. 1 shows schematically a generator unit comprising an electric machine, a rectifier and a generator controller, for which a method according to the invention can be carried out.

In FIG. 1, A generator unit comprising an electric machine 100 having a rectifier 130 and an arithmetic unit 140 designed as a generator controller, in which generator unit a method according to the invention can be carried out, is shown schematically. The electric machine 100 has a rotor or respectively excitation winding 110 and a stator winding 120 and is used as a generator for the voltage supply for an electrical system 150 of a motor vehicle in the present example.

The electric machine 100 and thus the stator winding 120 thereof is designed having five phases U, V, W, X and Z in the present embodiment. Each of the five phases is connected via an associated diode 131 of the rectifier 130 to a positive side or respectively high-side B+ of the vehicle electrical system 150 and via an associated diode 132 to a negative side or respectively low-side B− of the vehicle electrical system 150. It goes without saying that the number five of the phases is selected only by way of example in the present embodiment and that a method according to the invention can also be carried out with another number of phases, e.g. 3, 6, 7 or more. It is likewise possible to use suitable semiconductor switches instead of the diodes.

The generator controller 140 supplies an excitation current $I_E$ to the rotor winding 110. To this end, a switch can be provided in the generator controller 140, said switch being connected in series to the rotor winding 110 and setting the excitation current $I_E$, for example by means of a clocked control. The generator controller furthermore has inputs for detecting the vehicle electrical system voltage having B+ and B− as well as a phase voltage, in the present example of the phase Y, having voltage $U_Y$. A current delivered by the electric machine 100 is denoted with the reference sign $I_G$.

In FIGS. 2 to 5, the arrangement from FIG. 1 is shown in each case having respectively one specific error in the rectifier 130.

Figure 2:
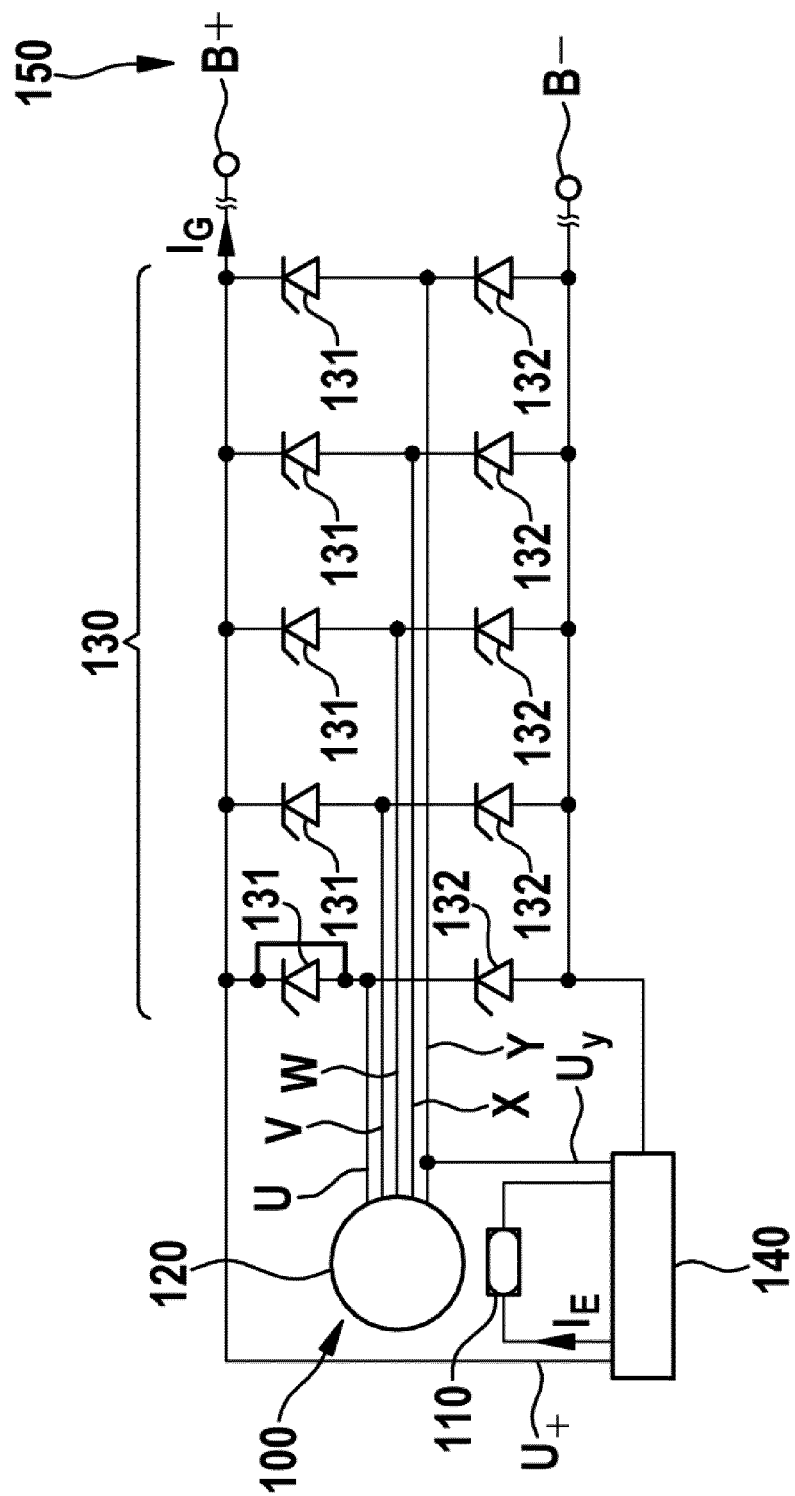
FIGS. 2 to 5 show the generator unit from FIG. 1 having different errors in the rectifier.

A short circuit in the high-side path, present in the phase U, is shown by way of example in FIG. 2. This can occur, for example, in the case of a short circuit in the associated diode 131.

Figure 3:
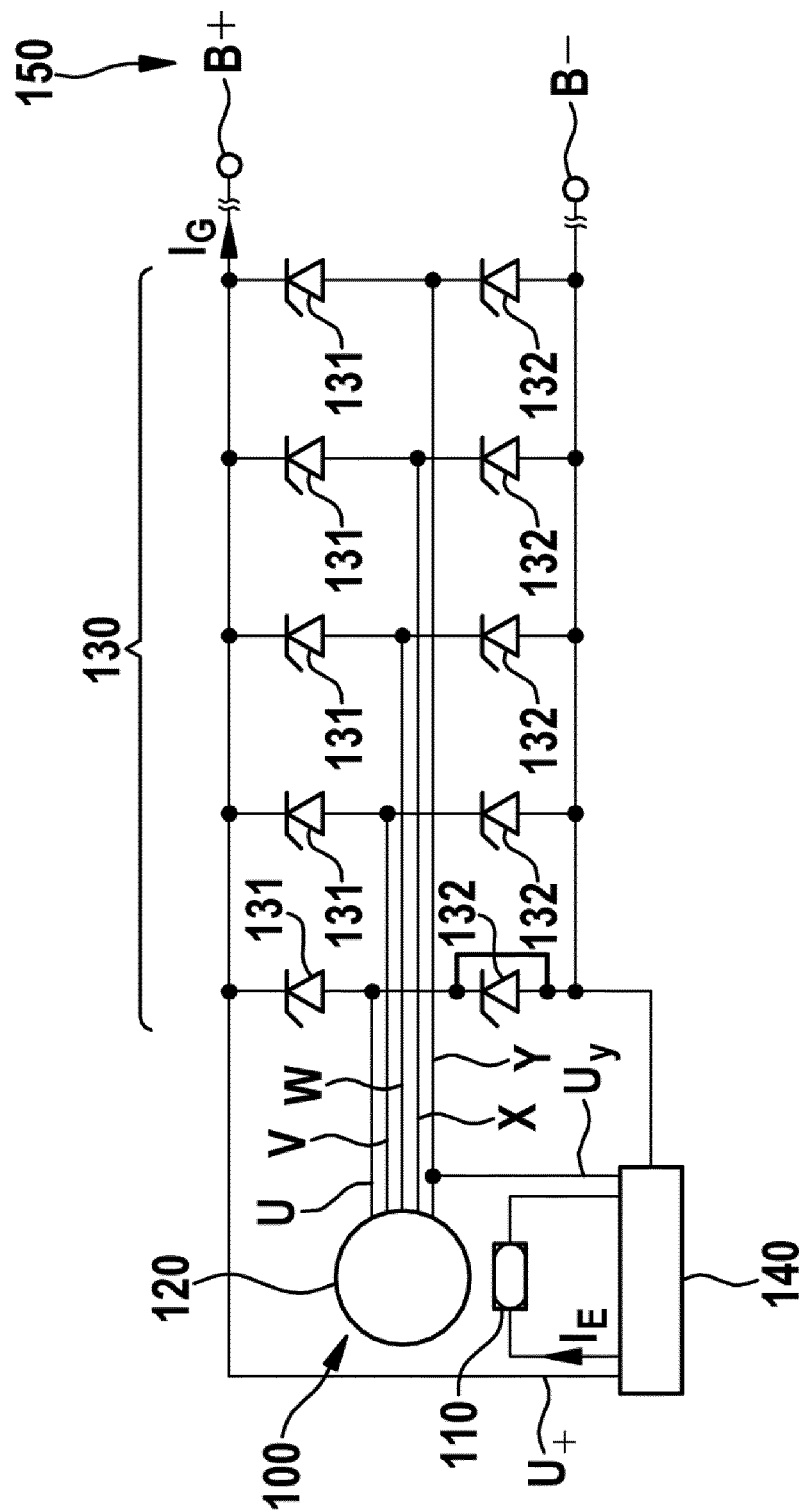

In FIG. 3, a short circuit in the low-side path, present in the phase U, is shown by way of example. This can occur, e.g., in the case of a short circuit in the associated diode 132.

Figure 4:
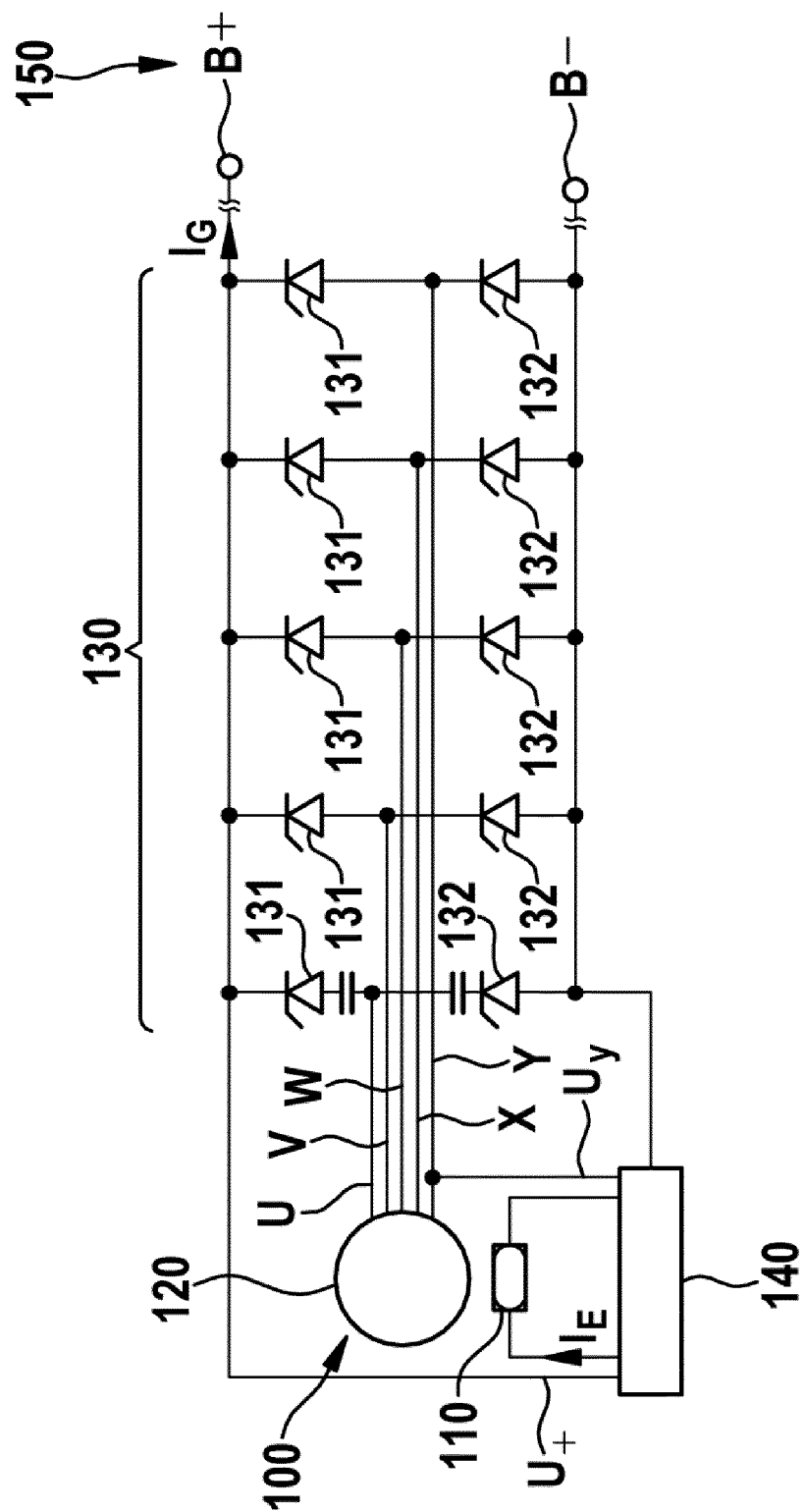

A separated phase, in the present example phase U, is shown by way of example in FIG. 4. This can, e.g., occur during a separation or destruction (non-conducting state) of the two associated diodes 131 and 132. This error however likewise occurs in case of a separation of the associated line to the stator winding 120 which is connected to both diodes.

Figure 5:
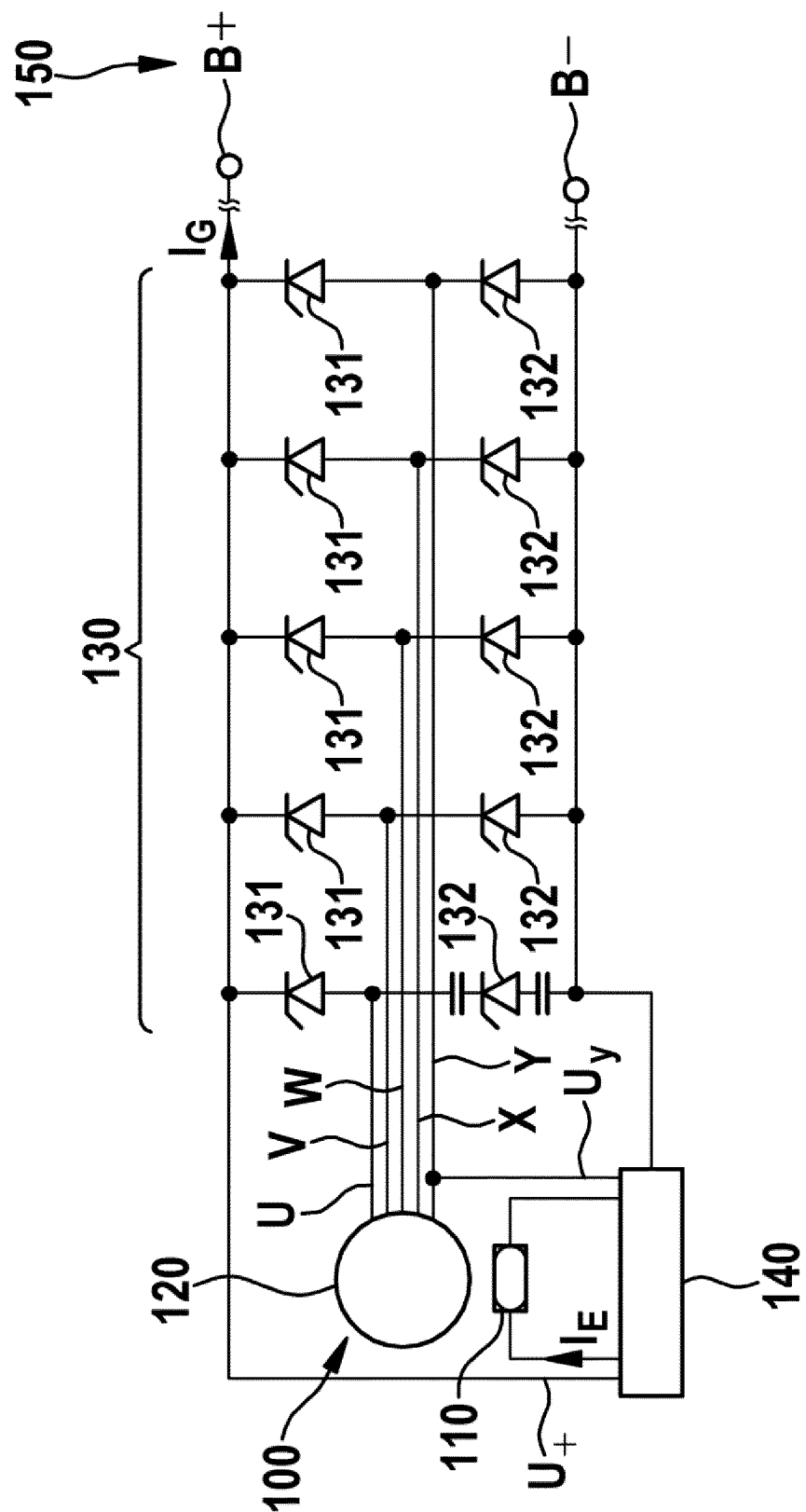

In FIG. 5, an interruption in a low-side path, present in the phase U, is shown by way of example. Such an interruption occurs, e.g., if the associated diode 132 is separated on one side of the diode or, as is shown in FIG. 5, on both sides of the diode or if the diode is, e.g., destroyed. An interruption in a high-side path would therefore occur, e.g., in the case of a separation or destruction of a diode 131.

In FIGS. 6 to 9, profiles of the generator voltage U, the generator current $I_G$, the phase voltage $U_Y$ of the phase Y (not in FIG. 7) and the excitation current $I_E$ are shown over the time t. A normal operation of the arrangement prevails prior to the point in time $t_0$, and an error in the generator unit occurs at the point in time $t_0$. Profiles, as they correspond to errors, as in the FIGS. 2 to 5, correspond to the profiles in the FIGS. 6 to 9. It should be pointed out here that the scaling of the individual diagrams in the case of current or respectively voltage as well as in the case of time do not always correlate, which is however not relevant for the present invention.

Figure 6:
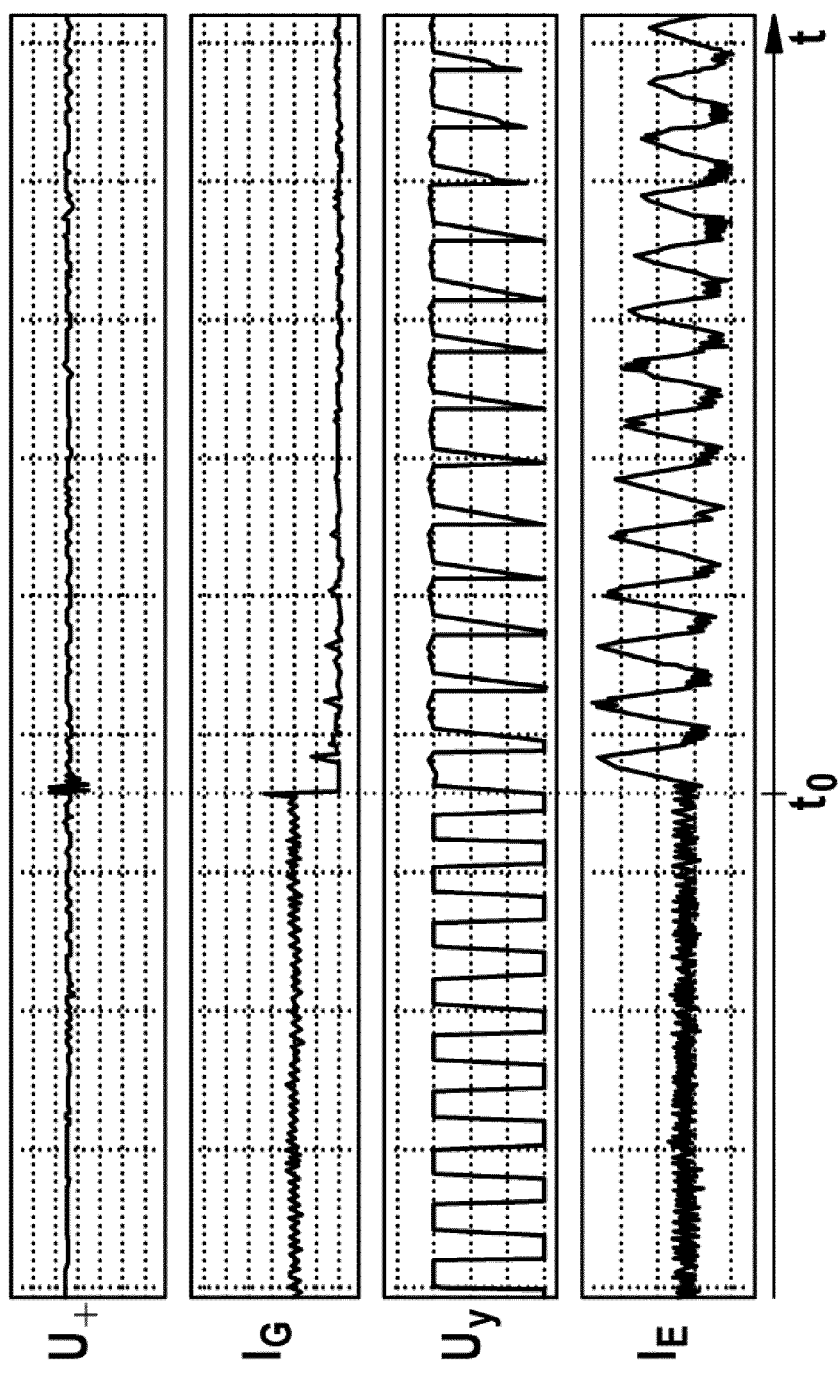
FIGS. 6 to 9 show in diagrams voltage and current profiles for the errors shown in FIGS. 2 to 5.

It can be seen in FIG. 6 that a short circuit in a high-side path in the case of the generator voltage becomes noticeable only a short time after the error occurs. The generator current decreases and the phase voltage changes with regard to the oscillation pattern thereof. A significant oscillation having a high amplitude in comparison to the profile without error can be seen in the excitation current. Although, in this case, the error could also be detected in the phase voltage, the error can be more clearly detected in the plot of the excitation current. The frequency f of the oscillation in 1/s corresponds here to:

$$f=n \cdot PPZ/60,$$

wherein n represents the rotational speed of the generator in 1/min and PPZ the number of pole pairs of the generator.

This plot of the excitation current results from an unsymmetrical distribution of the phase currents after the short circuit, which then contain a direct current component. As a result of the rotation of the electric machine, these uneven direct current components are then transferred to the rotor of the electric machine because the externally excited synchronous machine can be considered to be a transformer, which, on the one hand, enables a coupling of the rotor to the stator; however, on the other hand, also enables a feedback from the stator to the rotor. As a result, the excitation current receives a significant alternating current component, whereby the short circuit can be inferred.

Figure 7:
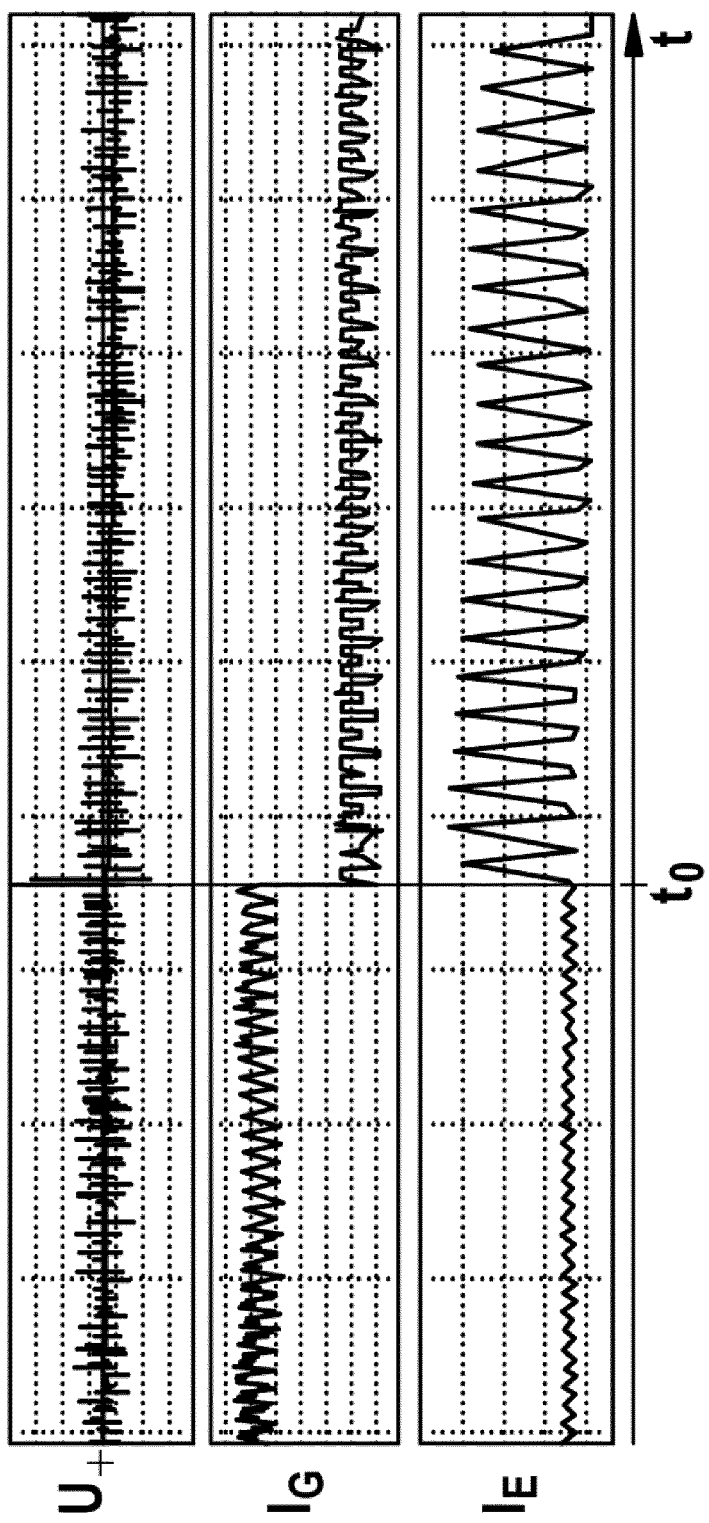

It can be seen in FIG. 7 that a short circuit in a low-side path at the generator voltage is noticeable only a short time after the error occurs and that the generator current decreases. A significant oscillation having a high amplitude in comparison to the profile without error can be seen in the excitation current as is also the case for the short circuit in the high-side path. As a result, the short circuit can be detected.

Figure 8:
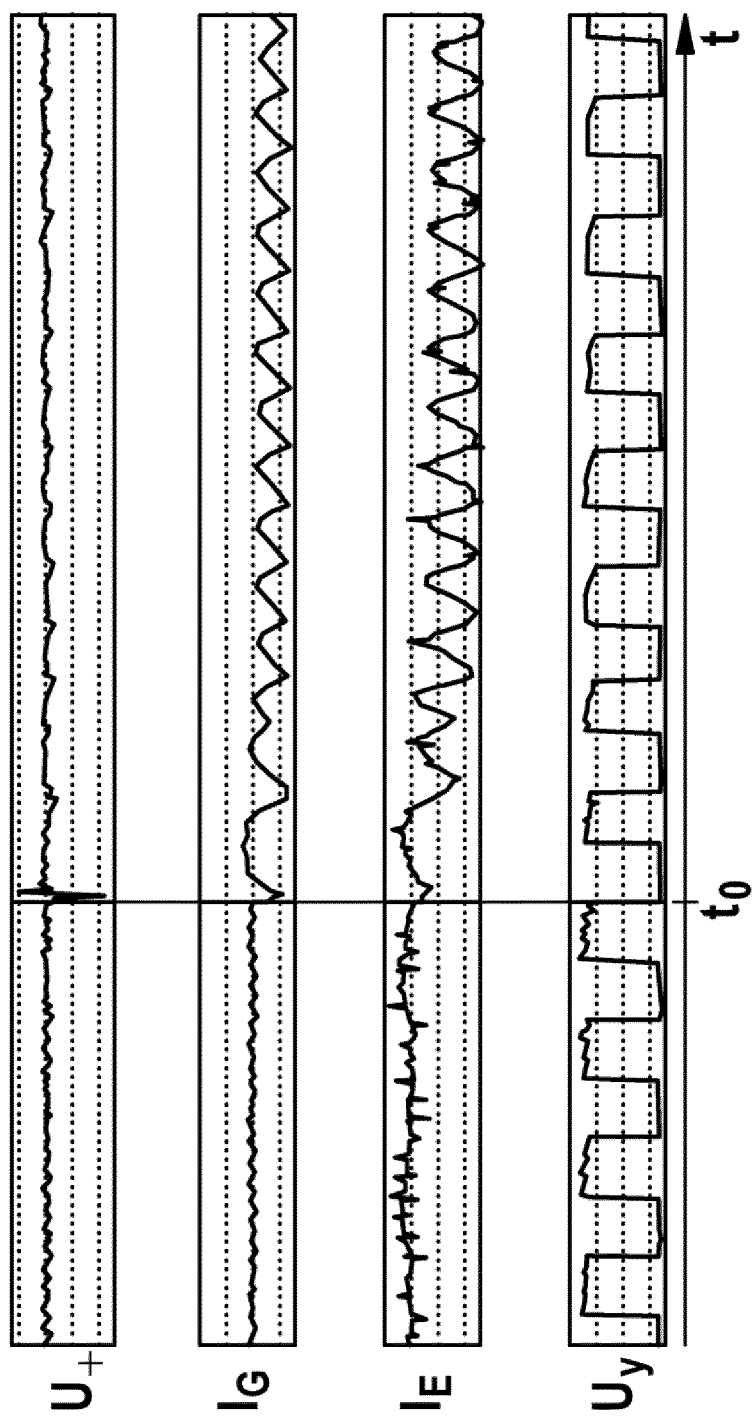

It can be seen in FIG. 8 that a separation of an entire phase at the generator voltage becomes apparent shortly after the error has occurred by means of a larger fluctuation in the voltage and subsequently only slightly by means of light fluctuations. The generator current passes into an oscillation having an increased amplitude. The excitation current decreases slightly and passes into an oscillation having significantly higher amplitude than before the error occurred. The phase voltage at the separated phase is no longer delimited by a rectification. Said phase voltage therefore shows the significantly higher no-load voltage of the electric machine. The phase voltage will however not change at the undamaged phases (as shown by way of example in the figure).

A detection of a separated phase using the phase voltage is therefore not possible except if the defect would randomly affect the only phase which is monitored. On the other hand, the separation of a phase can be clearly detected with the excitation current. An unsymmetrical phase distribution occurs here in turn. In the case of short circuits or interruptions, an additional direct current component results on the stator side, which is transferred as an alternating current component to the rotor side. During the separation of a phase, the phase current in the corresponding phase is however reduced to zero. Accordingly, the remaining phases have to compensate for this component and are thus asymmetrically loaded. In the case of an error in the separated phase, the frequency of the oscillation is twice as high as the previously depicted error cases and can thus be clearly distinguished from the same.

Figure 9:
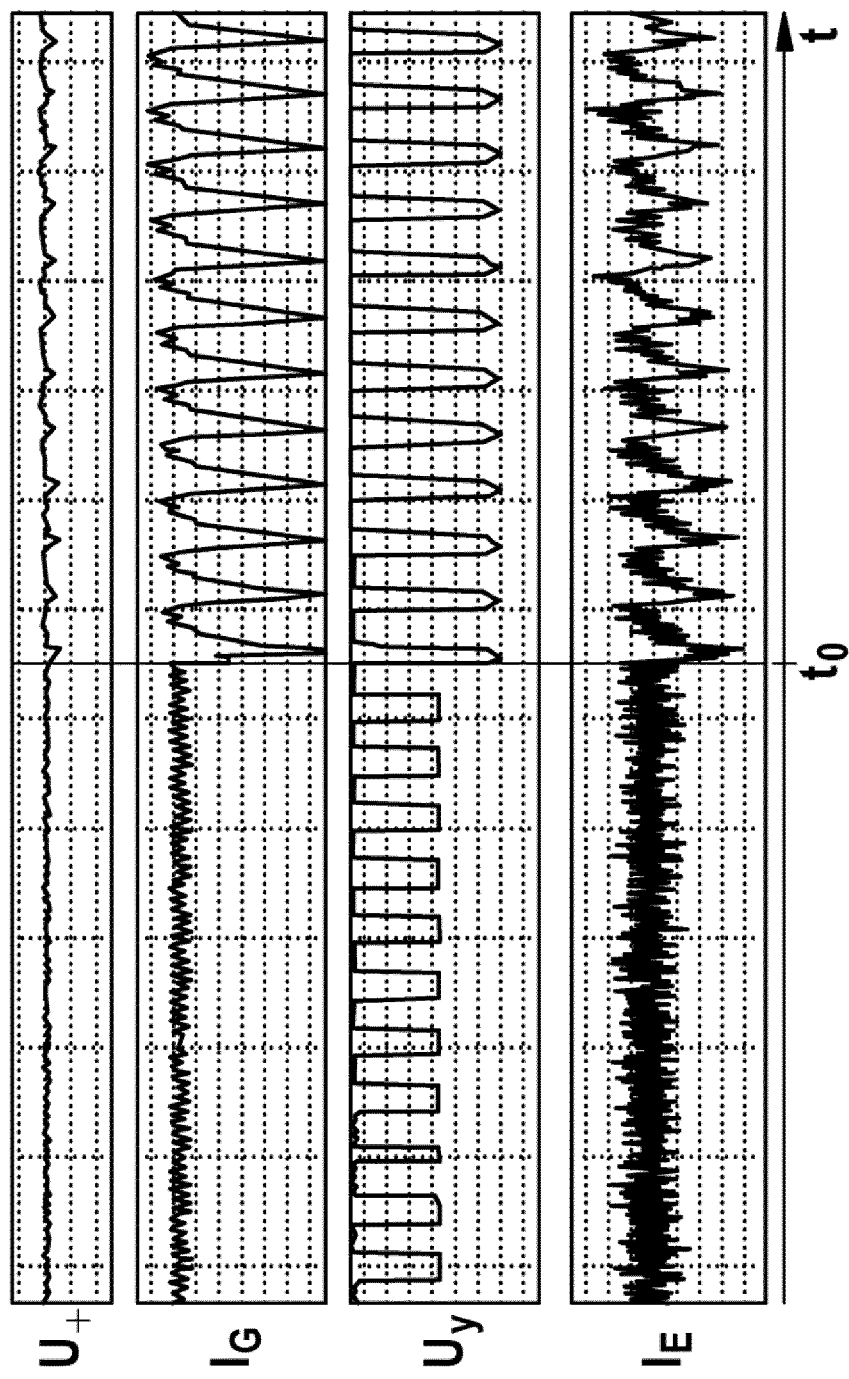

It can be seen in FIG. 9 that an interruption in a low-side path leads to slight fluctuations in the generator voltage. The generator current follows an oscillation, in which the value of the current goes toward zero in each case upon reaching the respective separated low-side path. The phase voltage has a higher amplitude than prior to the error, and the excitation current has likewise an oscillation having significantly higher amplitude.

Figure 10A:
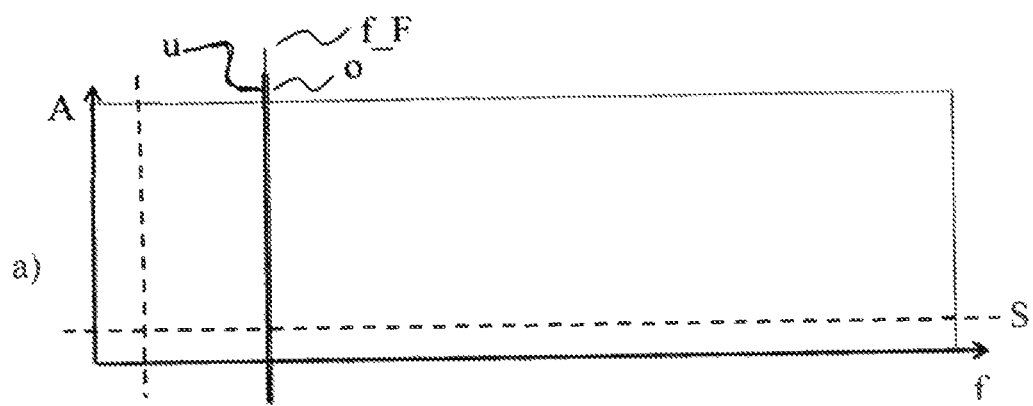
FIGS. 10a and 10b show in each case an amplitude spectrum of the plot of the excitation current.
Figure 10B:
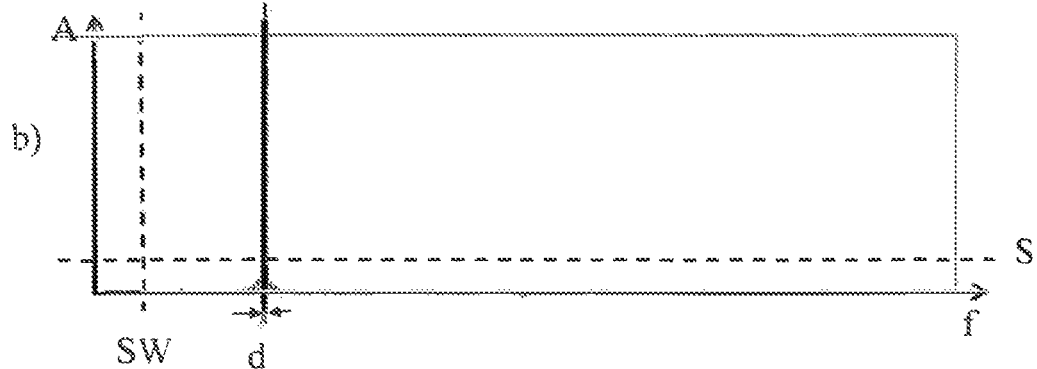

An amplitude spectrum of the plot of the excitation current $I_E$ is depicted in each case in FIGS. 10a and 10b. The amount A of the frequency spectrum is plotted over the frequency f. FIG. 10a shows such an amplitude spectrum for the normal case, FIG. 10b for one of the error cases illustrated above. As can clearly be seen, a significantly increased frequency component A results in the error case for frequencies f above the lower rotational speed limit SW. A frequency component A, which is greater than the threshold value S, results in the region between the lower frequency edge u and the upper frequency edge o, which together delimit a frequency interval of the width d. The accordingly identified error frequency f_F, on the basis of which it can be determined which error is present in the generator unit, lies within this frequency interval, for example in the middle between the lower frequency edge u and the upper frequency edge o.

It can already be deduced that an error is present from the mere fact that the frequency component A is greater than the threshold value S for a frequency interval of the width d.

On the basis of the error frequency f_F, it can particularly be identified whether a short circuit, such as in FIGS. 2 and 3, is present. Whether a short circuit of a phase illustrated in FIG. 2 to the high-side or a short circuit of a phase to the low-side as illustrated in FIG. 3 is present, can then be determined with the help of the phase voltage $U_Y$.

Figure 11:
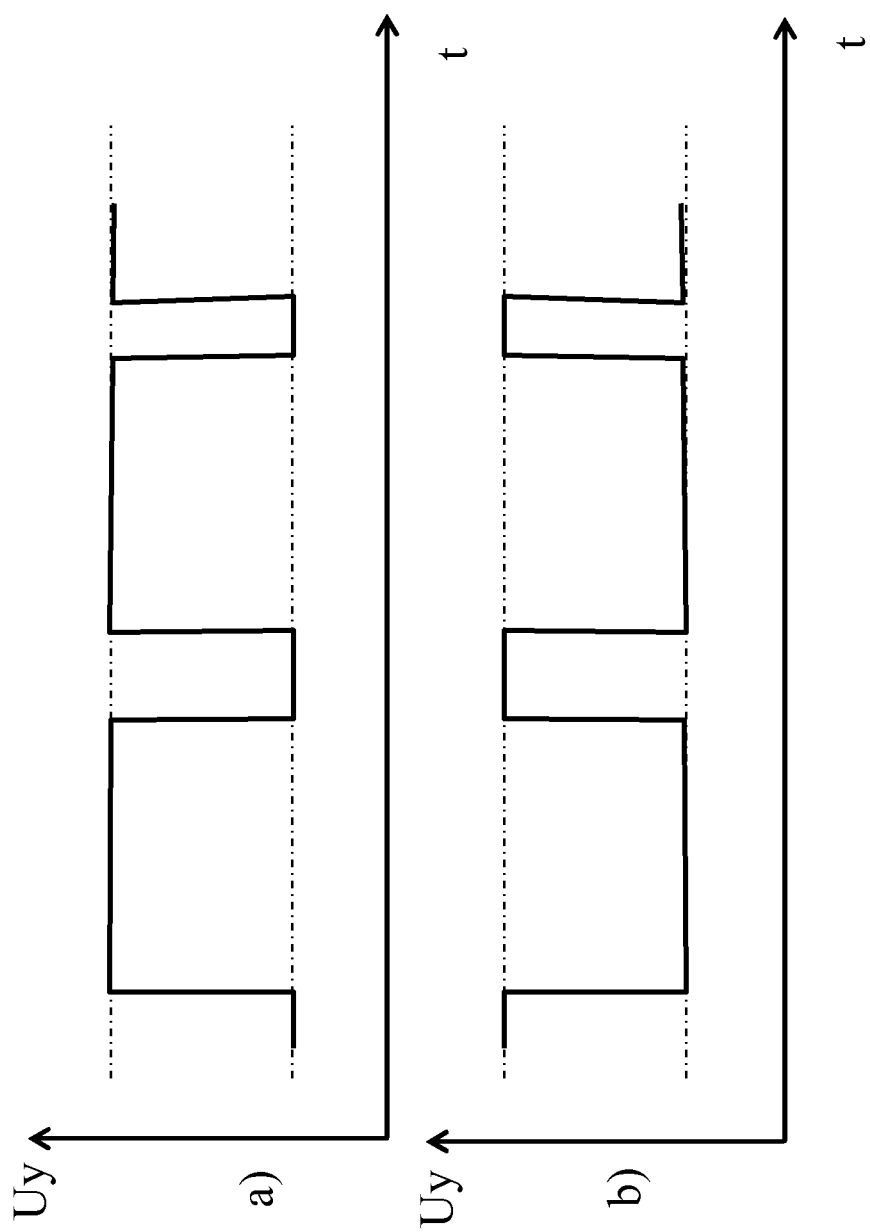
FIG. 11 shows the profile of a phase voltage in the case of a high-side short circuit of a phase.

In FIG. 11, the profile of the phase voltage $U_Y$ is depicted over the time t by way of example in the case of a high-side short circuit of the phase U (FIG. 11a) or respectively in the case of a low-side short circuit of the phase U. As can be seen, the signal of the durations of the phase levels of the phase voltage $U_Y$ changes to voltage level "high" or respectively "low". In the case of the high-side short circuit, the "high" phase level is widened with respect to the "low" phase level. In the case of the low-side short circuit, it is the other way around. In the normal case, "high" phase level and "low" phase level last the same amount of time. This is independent of the phase in which the short circuit is present.

Provided the short circuit, differently as illustrated in FIG. 11, lies directly in a phase Y, which is connected to the controller, a profile of the phase voltage $U_Y$ at the controller connection, which continuously lies at the high potential of the positive side B+, results in the case of a short circuit of this phase Y to the positive side B+ of the vehicle electrical system 150. In the case of a short circuit of this phase Y to the negative side B− of the vehicle electrical system 150, a phase voltage profile results which continuously lies at the lower potential of this low side B−.

Thus, a differentiation of the aforementioned error images is possible with the aid of the phase voltage $U_Y$.

In summary, it can be seen that all errors in the rectifier and/or the machine which were mentioned above can be detected using the frequency spectrum of the excitation current. Because the excitation current is detected in any event on account of the regulation in the generator controller, the present invention can be implemented very easily.

Provision can also be made for a detected error to be transmitted to a higher-level control device via an interface.

The invention claimed is:

1. A method for detecting an error in a generator unit of an electrical system (150) of a motor vehicle, the generator unit including a rectifier and an electric machine (100) including a rotor winding (110) and a stator winding (120), the method comprising:
   plotting, via a generator controller, the excitation current ($I_E$) flowing through the rotor winding (110) of the electric machine (100); and
   concluding, via the generator controller, that there is an error in the generator unit when a frequency component (A) of a frequency spectrum of the plot of the excitation current ($I_E$) is larger than a threshold value (S), the frequency spectrum being above a lower speed limit (SW).

2. The method according to claim 1, further comprising concluding that there is an error in the generator unit if a cumulative distribution function of the frequency spectrum in the frequency range above the lower (SW) speed limit is larger than the threshold value (S).

3. The method according to claim 1, wherein an error frequency (f_F) is determined, in the environment (o, u) of which the frequency component (A) of the frequency spectrum of the plot of the excitation current ($I_E$) is greater than the threshold value (S).

4. The method according to claim 3, wherein, depending on the determined error frequency, a decision is made for errors from a list of possible errors in the generator unit whether this error is present in the generator unit or not.

5. The method according to claim 4, wherein the list of possible errors comprises a short circuit and/or an interruption in a high-side path between the rectifier (130) and the vehicle electrical system (150), a short circuit and/or an interruption in a low-side path between the rectifier (130) and the vehicle electrical system (150) and/or a separation of one of the phases (U, V, W, X, Y) from the rectifier (130) and wherein, depending on the determined error frequency, a decision is made which of these errors is present.

6. The method according to claim 5, wherein the list of possible errors comprises the short circuit in the high-side path and/or the error in the low-side path, and wherein then, if the determined error frequency corresponds to a rotational speed of the generator multiplied by a number of pole pairs of the generator, it is decided that the short circuit is present in the high-side path or the error is present in the low-side path.

7. The method according to claim 6, wherein then, if it is decided that the short circuit is present in the high-side path or the error is present in the low-side path, depending on a temporal profile of a phase voltage, it is decided which of these two paths is that in which the short circuit is present.

8. The method according to claim 6, wherein then, if it is decided that the short circuit is present in the high-side path or the error is present in the low-side path, a reduction in the amount of the excitation current ($I_E$) or a pulsing of the excitation current ($I_E$) is carried out.

9. The method according to claim 5, wherein the list of possible errors comprises the separation of one of the phases (U, V, W, X, Y) from the rectifier (130), and wherein then it is decided there is the separation if the determined error frequency corresponds to twice a rotational speed of the generator multiplied by a number of pole pairs of the generator.

10. The method according to claim 4, wherein then, if it has been detected that an error is present in the generator unit and a decision is not made for any of the errors from the list of possible errors, the generator is shut down.

11. An Arithmetic unit (140), which is equipped to carry out a method according to claim 1.

12. A computer program, which causes an arithmetic unit (140) to carry out a method according to claim 1 if said program is executed on the arithmetic unit (140).

13. A non-transitory machine-readable storage medium having a computer program which causes an arithmetic unit (140) to carry out a method according to claim 1 if said program is executed on the arithmetic unit (140).

14. The Arithmetic unit (140), according to claim 11, wherein the arithmetic unit (140) is a generator controller.

* * * * *